(12) United States Patent
Yang

(10) Patent No.: US 7,495,910 B2
(45) Date of Patent: Feb. 24, 2009

(54) HEAT-DISSIPATING FAN FIXING DEVICE

(75) Inventor: Chun-Ying Yang, Taipei (TW)

(73) Assignee: Inventec Corporation, Taipei (TW)

( * ) Notice: Subject to any disclaimer, the term of this patent is extended or adjusted under 35 U.S.C. 154(b) by 201 days.

(21) Appl. No.: 11/635,499

(22) Filed: Dec. 8, 2006

(65) Prior Publication Data

US 2008/0137293 A1     Jun. 12, 2008

(51) Int. Cl.
 *H05K 7/20*     (2006.01)
(52) U.S. Cl. ................................................. 361/695
(58) Field of Classification Search .................. 361/695
 See application file for complete search history.

(56) References Cited

U.S. PATENT DOCUMENTS

| | | | | |
|---|---|---|---|---|
| 4,834,615 A | * | 5/1989 | Mauch et al. ............. | 415/213.1 |
| 5,101,321 A | * | 3/1992 | Remise et al. ............. | 361/695 |
| 5,208,730 A | * | 5/1993 | Tracy ........................ | 361/687 |
| 5,707,282 A | * | 1/1998 | Clements et al. ........... | 454/184 |
| 5,713,790 A | * | 2/1998 | Lin ............................ | 454/184 |
| 5,788,566 A | * | 8/1998 | McAnally et al. .......... | 454/184 |
| 6,040,981 A | * | 3/2000 | Schmitt et al. ............. | 361/695 |
| 6,134,115 A | * | 10/2000 | Sim et al. ................... | 361/747 |
| 6,215,659 B1 | * | 4/2001 | Chen ........................ | 361/695 |
| 6,236,564 B1 | * | 5/2001 | Fan ............................. | 361/695 |
| 6,343,011 B1 | * | 1/2002 | Yu ............................. | 361/695 |
| 6,351,380 B1 | * | 2/2002 | Curlee et al. ................ | 361/695 |
| 6,587,342 B1 | | 7/2003 | Hsu et al. | |
| 6,616,525 B1 | * | 9/2003 | Giraldo et al. ............. | 454/184 |
| 6,643,131 B1 | * | 11/2003 | Huang ....................... | 361/697 |
| 6,817,939 B2 | * | 11/2004 | Gan et al. ................... | 454/184 |
| 6,826,048 B1 | * | 11/2004 | Dean et al. .................. | 361/695 |
| 6,894,898 B2 | * | 5/2005 | Liu ............................ | 361/697 |
| 6,954,354 B2 | * | 10/2005 | Shyr ......................... | 361/683 |
| 7,031,157 B2 | * | 4/2006 | Horng et al. ................ | 361/695 |
| 7,245,490 B2 | * | 7/2007 | Chou et al. .................. | 361/695 |
| 7,261,516 B2 | * | 8/2007 | Liang et al. ................ | 415/213.1 |
| 7,301,768 B2 | * | 11/2007 | Fan et al. .................... | 361/695 |
| 7,385,813 B2 | * | 6/2008 | Lin ............................ | 361/695 |
| 7,405,933 B2 | * | 7/2008 | Kobayashi et al. .......... | 361/695 |

* cited by examiner

*Primary Examiner*—Anatoly Vortman
(74) *Attorney, Agent, or Firm*—Rabin & Berdo, P.C.

(57) ABSTRACT

A heat-dissipating fan fixing device used for accommodating and fixing a fan and mounted on a case is provided, which includes a frame, a plurality of hooks and an elastic buckle piece. The frame has a first end and a second end being opposite to each other. Between the first end and the second end, an accommodating space through the frame is formed for accommodating and fixing the fan. The hooks extend from one side edge of the first end, and the elastic buckle pieces are formed by bending along another side wall of the first end. Thus, when the frame is joined with the case, firstly, each hook catches the case, and then, the elastic buckle piece is embedded into the case, thereby mounting the fixing device with the fan on the case.

10 Claims, 6 Drawing Sheets

HEAT-DISSIPATING FAN FIXING DEVICE

BACKGROUND OF THE INVENTION

1. Field of Invention

The present invention relates to a heat-dissipating fan fixing device, and more particularly, to a fixing device for stacking a plurality of heat-sink fans thereon according to the heat radiation requirements.

2. Related Art

A main board, a CPU chip, and various disk drivers are installed within a computer case, the above units and elements generate a great deal of heat. In order to prevent the heat from negatively affecting the operation of the computer, it is necessary to take measures to dissipate the heat, so generally the design of a heat-dissipating fan is further required.

In the conventional method for assembling a heat-dissipating fan to a computer case, a plurality of screws or other locking elements are used to fix the heat-dissipating fan on the computer case. It may meet the demands for the computer host in which only one to two heat-dissipating fans are required. However, as for the relatively large-scale computer case, for example, the case of a server, which requires a large mount of heat-dissipating fans, the assembling operation is performed on each heat-dissipating fan, so it will be time consuming for assembling heat-dissipating fans.

With reference to U.S. Pat. No. 6,587,342 (hereinafter referred as patent 342), patent 342 provides an embedded heat-dissipating fan module, wherein the snapping manner is used to replace the fixing manner of using screws or locking elements, so as to achieve the object of quick assembling and disassembling. As shown in FIG. 2 of patent 342, a plate body 40 and a plate body 40' respectively extend outwards from both sides of the body 31, which have two fan vents 42 respectively, and the number of the fan vents 42 are designed according to requirements. A first fan cover 32a and a second fan cover 32b are pivotally connected to the body 31 respectively, so that the first fan cover 32a and the second fan cover 32b form a space with the plate body 40 and the plate body 40' respectively for accommodating the fan 11, and two fan vents are formed on each plate body 40, 40', for accommodating and disposing two fans 11 respectively.

The heat-dissipating fan in patent 342 are assembled along the extending direction of the plate body, that is, a plurality of heat-dissipating fans may be individually assembled on the case. Although the number of the heat-dissipating fans may be increased or decreased according to the heat dissipation requirements, too much area of the case is occupied. Under the circumstance of a limited case area, when being applied in a computer case with relatively large heat dissipation requirements, the heat-dissipating fans may be distributed all cover the case. Therefore, recently, it has become a technical issue to be solved that how to fix the heat-dissipating fan without using screws or other locking components, wherein the number of the heat-dissipating fans can be randomly increased or decreased according to the heat dissipation effect of the computer host, without occupying an excessive case area.

SUMMARY OF THE INVENTION

According to the above prior art, a user needs to use assembling tools to lock and fix the heat-dissipating fans on the case, which is time-consuming, and quite a lot of case area is occupied by a plurality of heat-dissipating fans. Accordingly, an objective of the present invention is to provide a heat-dissipating fan fixing device, which enables the user to assemble the heat-dissipating fan on the case without using any tools and saving the case area occupied by heat-dissipating fans.

In order to achieve the above objective, the present invention provides a heat-dissipating fan fixing device, for accommodating and fixing a fan and mounted on a case. The heat-dissipating fan fixing device includes a frame, a plurality of hooks, and an elastic buckle piece. The frame has a first end and a second end, wherein an accommodating space through the frame is formed between the first end and the second end for accommodating and fixing the fan. The hooks extend from one side edge of the first end for catching the case. The elastic buckle piece bends along another side wall of the first end, so as to be embedded into the case and thereby fixing the frame on the case.

The heat-dissipating fan fixing device of the present invention further includes a plurality of positioning portions and a buckle base. The positioning portions are disposed on the second end of the frame corresponding to each hook of another heat-dissipating fan fixing device, for bearing against each hook. The buckle base is disposed on the second end of the frame and is opposite to each positioning portion, for the elastic buckle piece of another heat-dissipating fan fixing device to embed therein, thus, the first end of another frame is fixed with the second end of the frame.

According to the heat-dissipating fan fixing device disclosed by the present invention, the hooks of the heat-dissipating fan fixing device are used to assemble the heat-sink fan on the case, without using any tools and locking elements, so as to simplify the stacking and assembling process and reduce the time for assembling. Meanwhile, the positioning pieces and the buckle base at another end are used to join the frame with another frame on the original case position, so as to be continuously stacked and assembled into a heat-dissipation structure with a plurality of heat-dissipating fans, thereby saving the case area occupied by heat-dissipating fans. In addition, the number of the required heat-dissipating fans may be increased or reduced according to the requirements of the heat-dissipation efficiency. For example, when it is intended to increase or reduce the heat-dissipation efficiency, the number of the stacked and assembled heat-dissipating fans may be increased or reduced accordingly, which has a large using variation flexibility.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

Figure 1A:
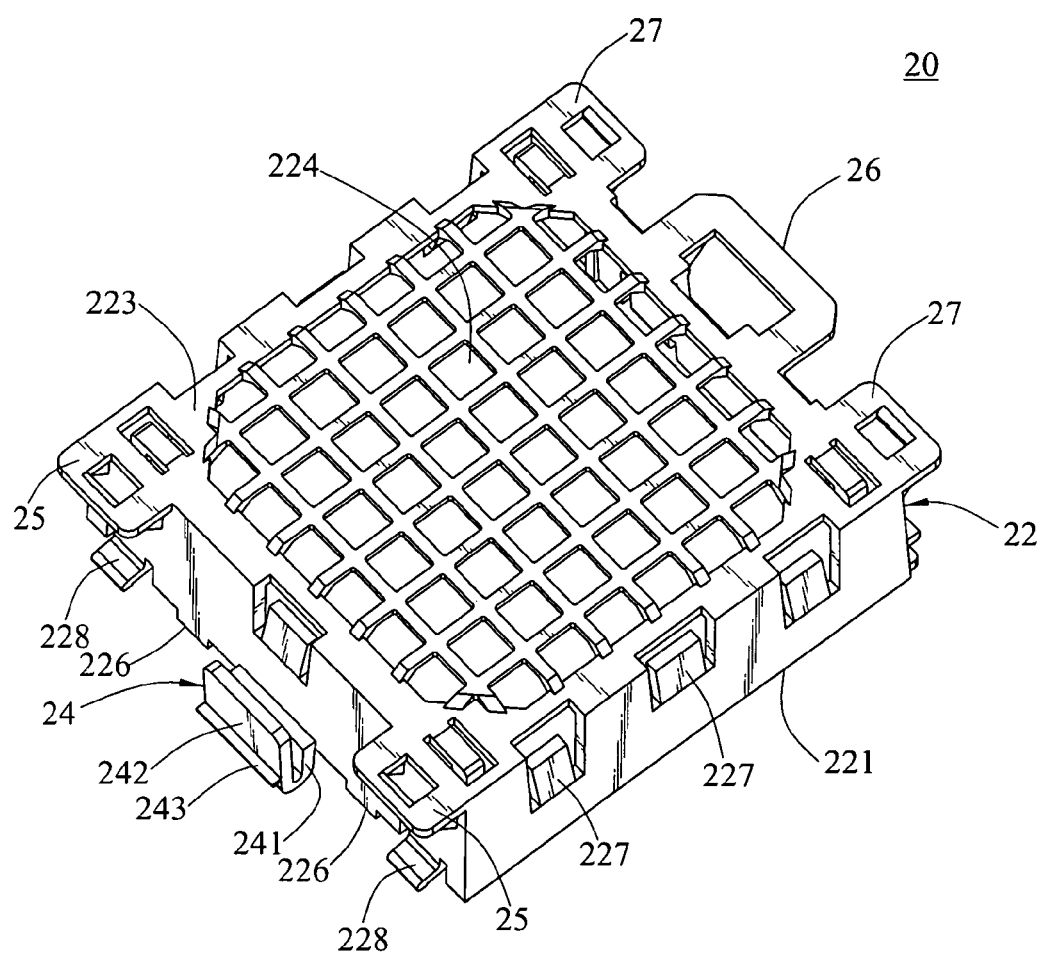
FIG. 1A is a front stereogram of a first embodiment of the present invention.

In order to further understand the objective, construction, feature, and function of the present invention, it is described below in great detail through the embodiments.

The implementation method of the present invention will be illustrated below through the following specific embodiments. It is easy for those skilled in the art to understand other advantages and efficacy of the present invention through the content of the specification. The present invention also can be implemented and practiced through other different specific embodiments, and the details of the specification may be changed and modified depending upon different viewpoints and applications, without departing from the spirit and scope of the invention.

Referring to FIGS. 1A, 1B, 2, and 3, a heat-dissipating fan fixing device 20 is provided for accommodating and fixing a heat-dissipating fan 40 therein, and it is mounted on a case 50. The heat-dissipating fan fixing device 20 includes a frame 22, a plurality of hooks 23, an elastic buckle piece 24, a plurality of positioning portions 25, and a buckle base 26. The frame 22 has a first end 221 and a second end 223 being opposite to the first end 221, and openings 224 are formed on the first end 221 and the second end 223 respectively. Herein, the opening 224 on the second end 223 is a hollow reticulation, for preventing foreign matters from entering the frame 22 through the second end 223. An accommodating space 225 through the frame 22 is formed between the first end 221 and the second end 223, which is provided for accommodating and fixing the heat-dissipating fan 40. The heat-dissipating fan 40 is used for dissipating the heat, which has fan blades 41 and a driving motor 42, wherein the driving motor 42 drives the fan blades 41 to rotate and thereby making the air to flow.

A plurality of positioning pieces 226 for snapping with the case 50 is disposed at the side edge of the first end 221 of the frame 22, and a plurality of through-holes 52 corresponding to each hook 23 and through-holes 53, 54 corresponding to the elastic buckle piece 24 and each positioning piece 226 are disposed on the case 50. In addition, a plurality of pads 227 is further disposed on the wall between the first end 221 and the second end 223 of the frame 22, which bears against the heat-dissipating fan 40 towards the direction of the accommodating space 225 of the frame 22.

The hooks 23 are formed on one side edge of the first end 221 of the frame 22, and herein, the number of the hooks 23 is two, but it is not limited to this. Each hook 23 has a connecting portion 232 and a hooking portion 234, wherein the connecting portion 232 extends from one side edge of the first end 221, and the hooking portion 234 extends opposite to the connecting portion 232.

The elastic buckle piece 24 is formed along another side wall of the first end 221 of the frame 22 by bending, wherein the elastic buckle piece 24 has a joining portion 241, a pressing portion 242, and a blocking portion 243. The joining portion 241 extends along another side wall of the first end 221 and bends away from the direction of the wall to join with the pressing portion 242. The blocking portion 243 extends along a opposite direction from the pressing portion 242, so as to form a bump.

The positioning portions 25 are disposed on the side edge of the second end 223 corresponding to the position of each hook 23' of another frame 22', and two side plates 251 are disposed for connecting each positioning piece 25 with the wall of the frame 22, and herein, each positioning portion 25 is an open-hole. In addition, a plurality of isolating pieces 228, 229 is further disposed on the side edge of the first end 221 of the frame 22, and a plurality of stopping portions 27' is further disposed on the side edge of the second end 223' of another frame 22' corresponding to each isolating piece 228.

The buckle base 26 is disposed on another side edge of the second end 223, and is opposite to the positioning portions 25, and for the elastic buckle piece of another frame 22' to embed therein, and herein, the buckle base 26 is an open-hole.

Figure 1B:
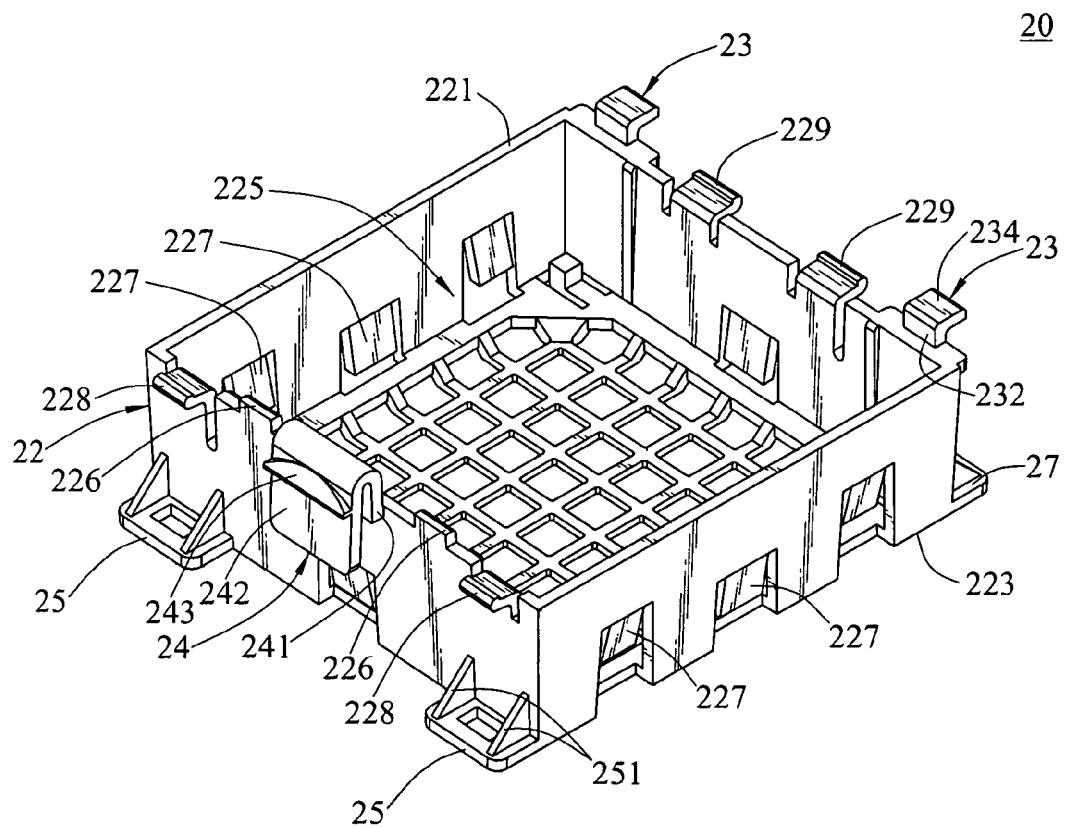
FIG. 1B is a back stereogram of the first embodiment of the present invention.
Figure 2:
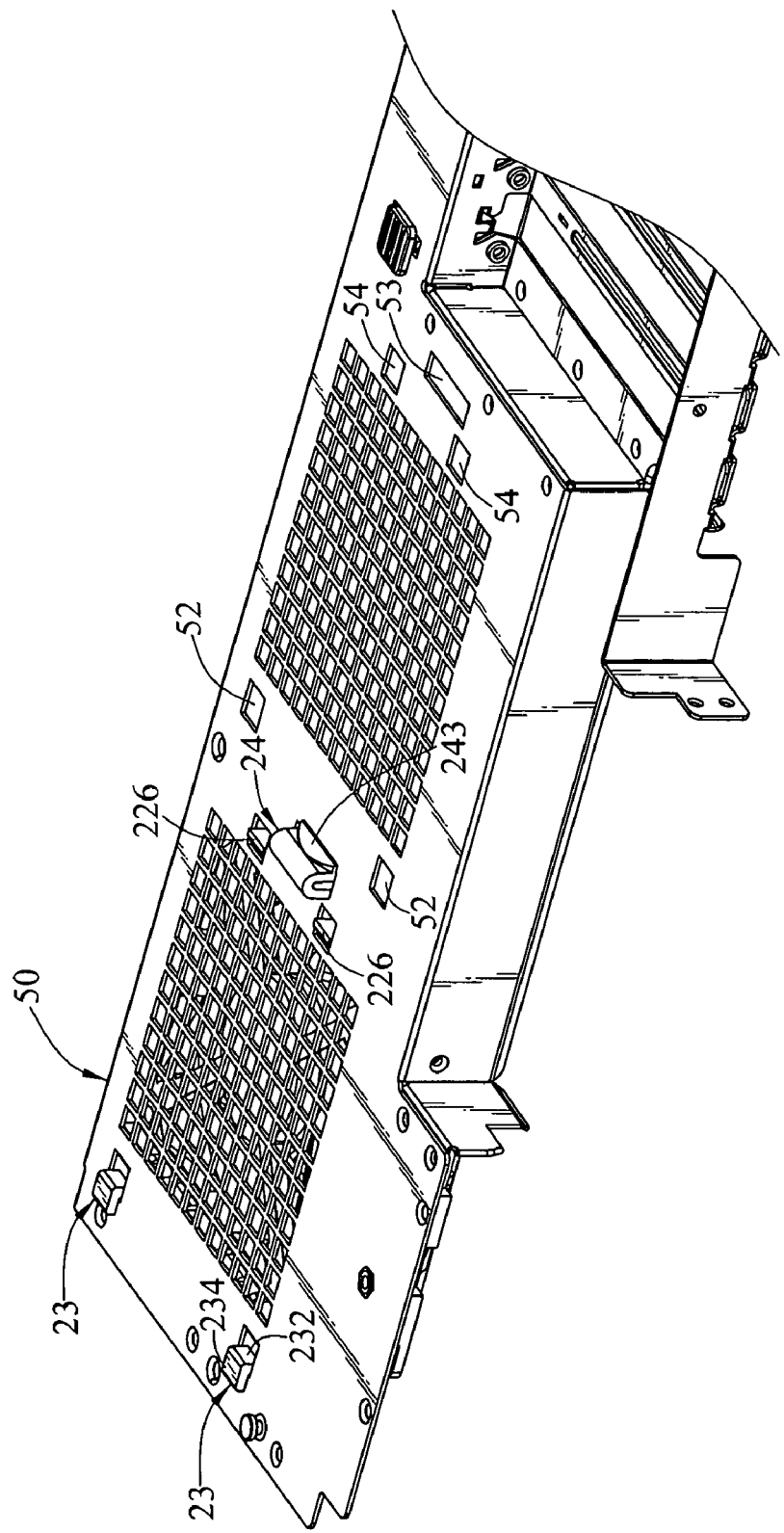
FIG. 2 is a schematic view of each hook, elastic buckle piece, and each positioning piece snapping with the case of the first embodiment of the present invention.

Referring to FIGS. 1A, 1B, and 2, when the heat-dissipating fan fixing device 20 is mounted on the case 50, firstly, the heat-dissipating fan fixing device 20 and the case 50 are positioned according to each other, and the first end 221 of the frame 22 faces the case 50, so that each hook 23, the elastic buckle piece 24, and each positioning piece 226 of the frame 22 may be inserted into the case 50. Particularly, each hook 23 of the frame 22 is firstly inserted into the through-hole 52 of the case 50, for catching the case 50. Each hook 23 slightly moves along the direction of the hooking portion 234, to make the connecting portion 232 bear against the edge of the through-hole 52, so as to see whether the elastic buckle piece 24 and each positioning piece 226 are accurately aligned with each other. If they are not accurately aligned with each other, the pressing portion 242 of the elastic buckle piece 24 may be pressed, or the hook 23 is slightly moved along the opposite direction of the hooking portion 234, such that the elastic buckle piece 24 is well inserted and fixed corresponding to the position of the through-hole 53. After the adjusting operation is finished, the elastic buckle piece 24 and each positioning piece 226 of the frame 22 are inserted into the through-holes 53, 54 of the case 50, thereby being embedded into the case 50.

When the elastic buckle piece 24 is inserted into the through-hole 53, the blocking portion 243 of the elastic buckle piece 24 is pressed by the edge of the through-hole 53, so that the pressing portion 242 is deformed towards the direction of the joining portion 241 to pass through the through-hole 53. After the elastic buckle piece 24 passes through the through-hole 53, the blocking portion 243 bears against another edge of the case 50, and meanwhile, each hook 23 is griped at the through-hole 52 by the hooking portion 234. Thus, the frame 22 is joined with the case 50 and is fixed. In addition, the isolating pieces 228, 229 are pressed against the end surface of the case 50, so as to absorb the vibration of the case 50, thereby achieving the effect of absorbing vibration and reducing noises.

Figure 3:
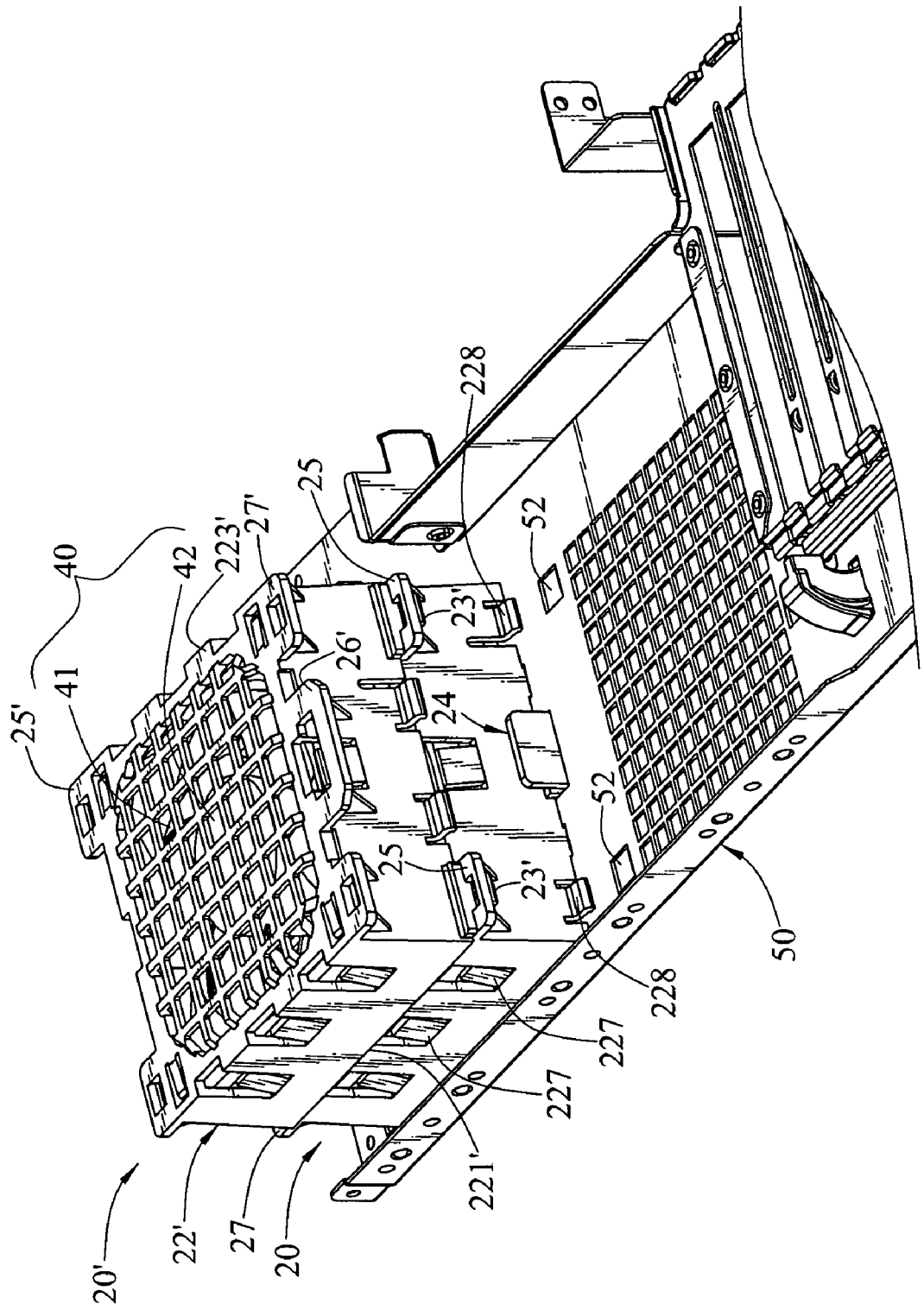
FIG. 3 shows a stacking and assembling state of the first embodiment of the present invention.

Referring to FIGS. 1A, 1B, and 3, after the heat-dissipating fan fixing device 20 is mounted on the case 50, another heat-dissipating fan fixing device 20' is stacked and assembled on the heat-dissipating fan fixing device 20, so as to enhance the heat dissipation effect. Firstly, each hook 23' located at the first end 221' of another frame 22' extends into each positioning portion 25 of the second end 223 of the frame 22, so that each hook 23' bears against each positioning portion 25. Then, the elastic buckle piece located at the first end 221' of the frame 22' is embedded into the buckle base 26 located at the second end 223 of the frame 22. In this manner, the first end 221' of another frame 22' is fixed with the second end 223 of the frame 22, such that the heat-dissipating fan fixing devices 20, 20' are joined with each other. In addition, after the joining process, the isolating pieces of the frame 22' press against the stopping portion 27 of the frame 22, so as to absorb the vibration of the heat-dissipating fan fixing device 20.

In the first embodiment, the air flow comes into and goes out of the case through the first end and the second end of the frame, so that the heat-dissipating fan in the frame can be used to dissipate the heat. However, the normal direction of the first end and the second end of the frame is vertical to the end surface of the case, thus, the flow in and flow out directions of the air flow is restricted. In order to make the air flow have more flow in and out routes to dissipate the heat, the present invention further discloses a second embodiment.

Figure 4:
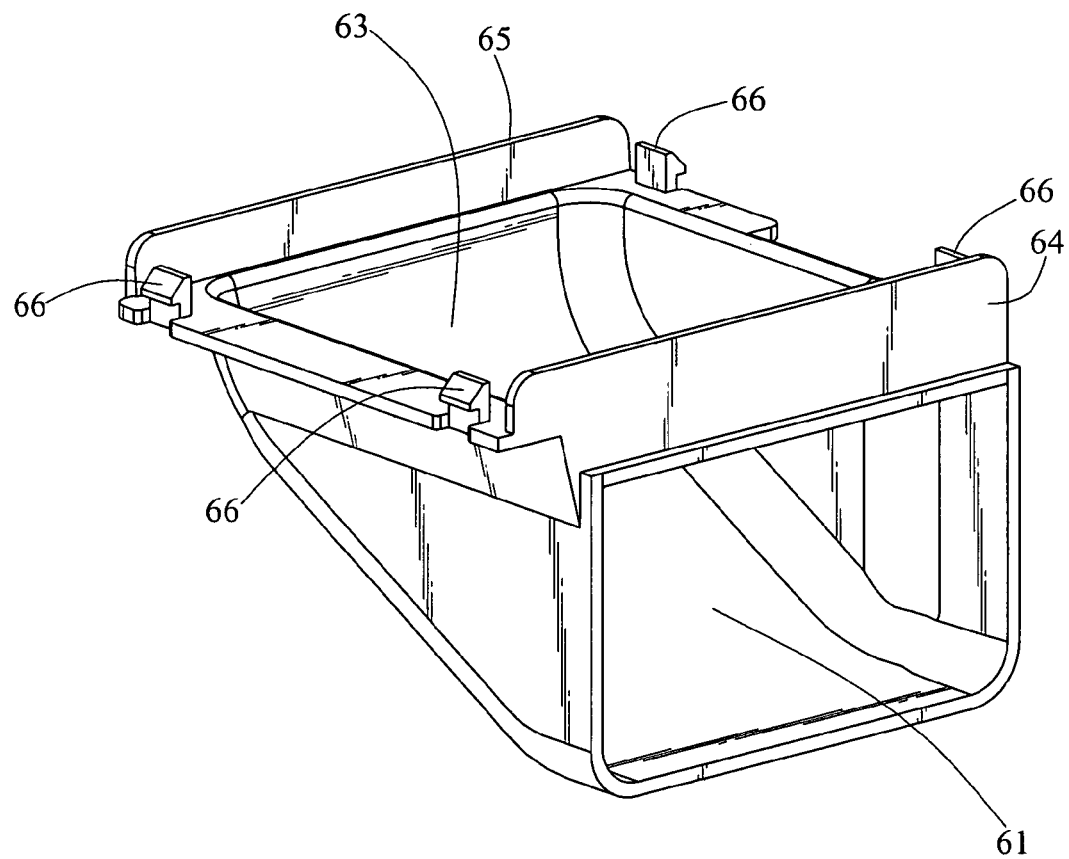
FIG. 4 is a stereogram of the appearance of a wind scooper of a second embodiment of the present invention.
Figure 5:
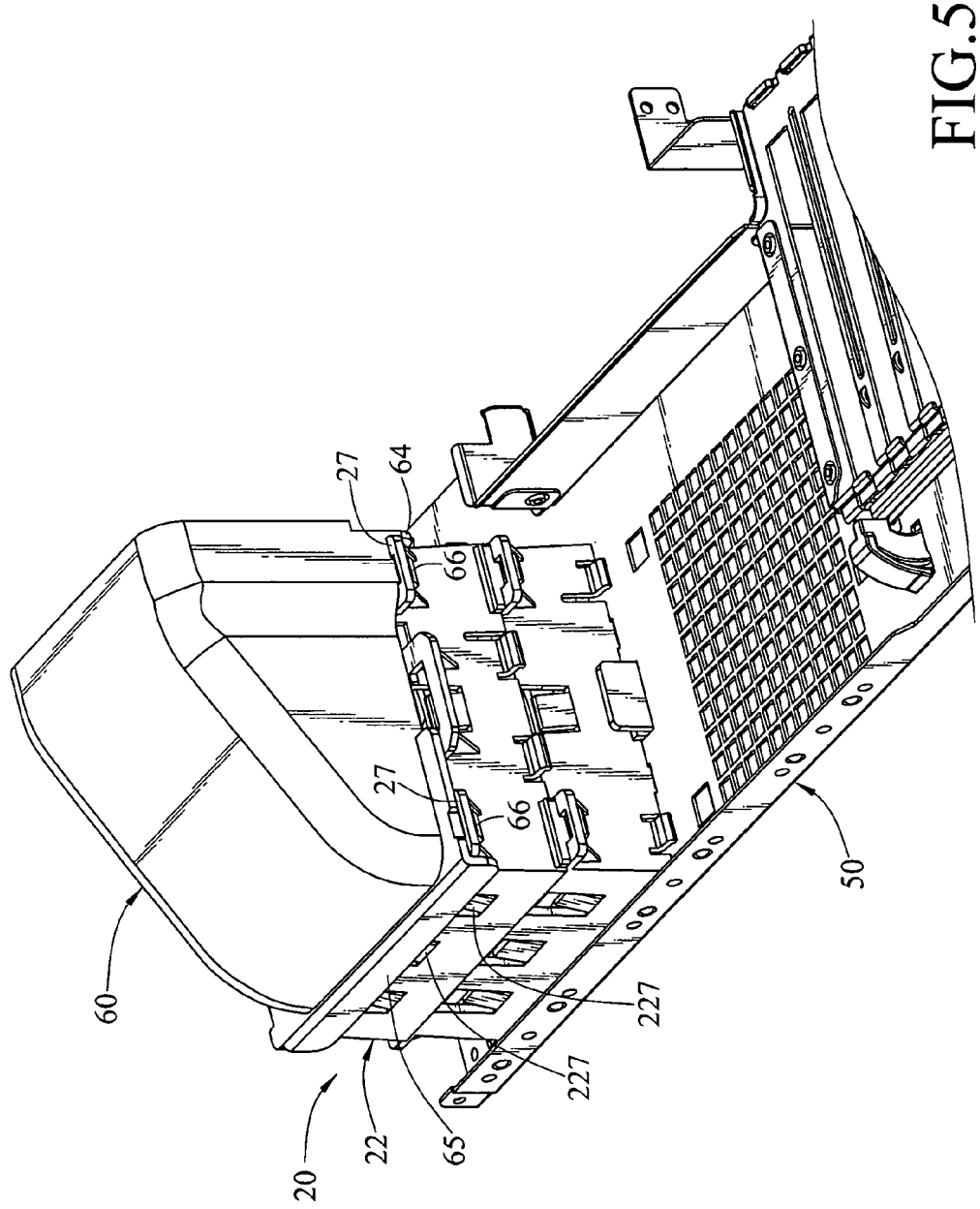
FIG. 5 is a stereogram of the appearance of the second embodiment of the present invention disposed with the wind scooper.

Referring to FIGS. 4 and 5, the heat-dissipating fan fixing device according to the second embodiment of the present invention further includes a wind scooper 60, for joining with the frame 22 of the heat-dissipating fan fixing device 20. A first vent 61 and a second vent 63 are respectively formed at two opposite ends of the wind scooper 60, a wing piece 64 and a wing piece 65 are respectively extended from the periphery of the first vent 61 and the corresponding periphery of the second vent 63. In addition, a wind scooper 60 has a plurality of buckling portions 66 respectively matching with each positioning portion 25 and each stopping portion 27. The buckling portion 66 is located at the periphery of the second vent 63.

Referring to FIGS. 4 and 5, when the wind scooper 60 is joined with the frame 22 of the heat-dissipating fan fixing device 20, the second vent 63 faces the second end 223 of the frame 22, and each buckling portion 66 is aligned with each positioning portion 25 and each stopping portion 27 of the frame 22. The wing pieces 64, 65 make the wind scooper 60 be positioned along the joining direction, thus, each buckling portion 66 is correctly buckled on each positioning portion 25 and each stopping portion 27 of the frame 20, so as to join the wind scooper 60 on the frame 22 of the heat-dissipating fan fixing device 20. Therefore, the wind scooper 60 transmits the cold air flow to the high heat position to remove the heat energy or absorb the heat, so as to perform the heat-dissipation operation.

In the present invention, the snapping mechanism on the heat-dissipating fan fixing device is used to assemble the heat-dissipating fan fixing device on the case or on another heat-dissipating fan fixing device, thus, a plurality of heat-dissipating fan fixing devices may be stacked and disposed, so as to form heat-dissipating fans with heat dissipation effect, and to avoid the crash of the computer host caused by the failure of a single heat-dissipating fan. Meanwhile, the number of the heat-dissipating fans may be increased or reduced according to the heat-dissipation requirements, and it is easy for the user to remove and change the heat-sink fans, so as to avoid the defects of the conventional unity structure that one of the heat-dissipating fan groups cannot be changed or assembled individually. Therefore, the present invention has relative large using variation flexibility. Furthermore, when the heat-dissipating fan fixing devices are assembled on the case or mutually stacked and assembled with each other, the staking and assembling process is performed without using any tools, which is convenient for the user to operate.

What is claimed is:

1. A heat-dissipating fan fixing device, for accommodating and fixing a fan, and mounted on a case, comprising:
   a frame, having a first end and a second end being opposite to the first end, wherein an accommodating space through the frame is formed between the first end and the second end for accommodating and fixing the fan;
   a plurality of hooks, extending from one side edge of the first end, so as to catch the case; and
   an elastic buckle piece, formed by bending along another side wall of the first end, for embedding into the case, so as to fix the frame on the case;
   a plurality of positioning portions, disposed on the second end corresponding to the hooks of another heat-dissipating fan fixing device, for bearing against the hooks; and
   a buckle base, disposed on the second end and being opposite to the positioning portions, and for the elastic buckle piece of another heat-dissipating fan fixing device to embed therein, so as to fix the first end of another frame with the second end of the frame.

2. The heat-dissipating fan fixing device as claimed in claim 1, wherein a plurality of positioning pieces is further disposed at a side edge of the first end of the frame and used for snapping with the case.

3. The heat-dissipating fan fixing device as claimed in claim 1, wherein a plurality of isolating pieces is further disposed on the side edge of the first end of the frame, a plurality of stopping portions is further disposed on the side edge of the second end of another frame corresponding to the isolating pieces, and the isolating pieces and the stopping portions mutually bear against each other.

4. The heat-dissipating fan fixing device as claimed in claim 1, wherein a plurality of pads is further disposed on the wall between the first end and the second end of the frame, and the pads bear against the fan towards the direction of the accommodating space.

5. The heat-dissipating fan fixing device as claimed in claim 1, wherein each of the hooks has a connecting portion and a hooking portion correspondingly extending from the connecting portion, and the hooks catch the case via the hooking portions.

6. The heat-dissipating fan fixing device as claimed in claim 1, wherein the elastic buckle piece has a joining portion, a pressing portion, and a blocking portion; the joining portion extends along another side wall of the first end and bends away from the direction of the wall to join with the pressing portion; and the blocking portion extends along a opposite direction from the pressing portion.

7. The heat-dissipating fan fixing device as claimed in claim 1, wherein the positioning portions are open-holes.

8. The heat-dissipating fan fixing device as claimed in claim 3, further comprising a wind scooper having a plurality of buckling portions matching with the positioning portions and the stopping portions.

9. The heat-dissipating fan fixing device as claimed in claim 8, wherein a first vent and a second vent are respectively formed at two opposite ends of the wind scooper; a wing piece is respectively extended from the periphery of the first vent and the corresponding periphery of the second vent; and when the wind scooper is joined with the frame, the wing pieces enable the wind scooper to snap with the positioning portions and the stopping portions of the frame along the joining direction by the buckling portions.

10. A heat-dissipating fan fixing device, for accommodating and fixing a fan, and mounted on a case, comprising:
   a frame, having a first end and a second end being opposite to the first end, wherein an accommodating space through the frame is formed between the first end and the second end for accommodating and fixing the fan;
   a plurality of hooks, extending from one side edge of the first end, so as to catch the case;
   an elastic buckle piece, formed by bending along another side wall of the first end, for embedding into the case, so as to fix the frame on the case;
   a plurality of isolating pieces, disposed on the side edge of the first end of the frame; and
   a plurality of stopping portions, disposed on the side edge of the second end of another frame corresponding to the isolating pieces, the isolating pieces and the stopping portions mutually bearing against each other.

* * * * *